United States Patent
Ganta et al.

(10) Patent No.: US 10,070,222 B1
(45) Date of Patent: Sep. 4, 2018

(54) MICROPHONE SYSTEM HAVING MICROPHONE TRANSDUCER IN FEEDBACK LOOP WITH ADJUSTABLE FREQUENCY -3DB POINT AND IMPROVED SETTLING SPEED

(71) Applicants: Akustica, Inc., Pittsburgh, PA (US); Robert Bosch GmbH, Stuttgart (DE)

(72) Inventors: Saikrishna Ganta, Milpitas, CA (US); Chinwuba Ezekwe, Albany, CA (US)

(73) Assignees: Akustica, Inc., Pittsburgh, PA (US); Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/471,502

(22) Filed: Mar. 28, 2017

Related U.S. Application Data

(60) Provisional application No. 62/459,836, filed on Feb. 16, 2017.

(51) Int. Cl.
*H04R 3/00* (2006.01)
*H04R 3/06* (2006.01)
*H03F 3/45* (2006.01)

(52) U.S. Cl.
CPC .......... *H04R 3/06* (2013.01); *H03F 3/45475* (2013.01); *H03F 2203/45212* (2013.01); *H03F 2203/45288* (2013.01); *H04R 2201/003* (2013.01)

(58) Field of Classification Search
CPC ....................................................... H04R 3/06
See application file for complete search history.

(56) References Cited

U.S. PATENT DOCUMENTS

| | | |
|---|---|---|
| 7,634,096 B2 | 12/2009 | Fallesen |
| 2014/0086433 A1 | 3/2014 | Josefsson |
| 2015/0131813 A1* | 5/2015 | Kim ...................... H03F 1/0266 381/119 |
| 2015/0137834 A1* | 5/2015 | Steiner ...................... H03F 1/34 324/686 |

* cited by examiner

*Primary Examiner* — James Mooney
(74) *Attorney, Agent, or Firm* — Maginot Moore & Beck LLP

(57) ABSTRACT

A microphone biasing circuit comprises a first amplifier having an output connected to a first node and an input connected to a second node; and a first feedback path connected from the first node to the second node. The first feedback path comprises a microphone having a first terminal connected to the first node and a second terminal connected to a third node, the microphone being configured to provide a sensed voltage at the first node in response to sound, the third node having a first DC bias voltage; and a first capacitor connected between the third node and the second node.

19 Claims, 9 Drawing Sheets

MICROPHONE SYSTEM HAVING MICROPHONE TRANSDUCER IN FEEDBACK LOOP WITH ADJUSTABLE FREQUENCY -3DB POINT AND IMPROVED SETTLING SPEED

This application claims the benefit of priority of U.S. provisional application Ser. No. 62/459,836, filed on Feb. 16, 2017 the disclosure of which is herein incorporated by reference in its entirety.

FIELD

The device disclosed in this document relates to microphone biasing circuits and, more particularly, to microphone biasing circuits having a microphone transducer in a feedback loop.

BACKGROUND

Microphones are transducers that convert sound into an electrical signal. Microphones are used in a multitude of different applications, such as sound recording, telephones, hearing aids, and various sensor systems. Microphones generally operate most accurately within a particular range of sound levels, depending on a sensitivity and configuration of the microphone. In very loud sound environments, the output signal of the microphone will often become distorted. Particularly, essentially any microphone will have an acoustical overload point (AOP), which is a level of sound at which the microphone can no longer effectively distinguish between the actual sound signal and noise/distortion. For example, the AOP may be defined as the sound pressure level at which distortion in the output signal reaches 10%.

Some types of microphones, such as condenser microphones and capacitive MEMS (microelectromechanical systems) microphones, require a DC bias voltage in order to operate. MEMS microphones additionally require a very high resistance to establish proper DC biasing. This resistance is on the order of few 100's of Giga Ohms.

FIG. 1a shows a microphone circuit 1 for biasing a MEMS microphone 10. The microphone circuit 1 includes charge pump 5 that provides a DC bias voltage for the microphone 10. The circuit 1 includes diodes 25 and 35 which are coupled antiparallel to one another between the charge pump 5 and a node 50. A capacitor 60 is connected between the node 50 and ground. The microphone 10 is connected between the node 50 and a node 40. The microphone 10 modulates the voltage at the node 40 to provide a sensed voltage in response to sound. The circuit 1 further includes diodes 20 and 30 which are coupled antiparallel to one another between the node 40 and ground. Finally, the circuit 1 includes a pre-amplifier 70 having an input connected to the node 40, which provides an output signal at an output node 80 based on the sensed voltage.

One disadvantage of the circuit 1 is that the sensed voltage at the node 40 often has an undesired DC offset. Particularly, due to parasitic resistance $R_{parasitic}$ of the microphone 10, a small leakage current flows from the node 50 to the node 40, through the microphone 10. The leakage current then flows from the node 40 to ground, through the diodes 20, 30. As a result of the leakage current, the sensed voltage may have a shifted DC offset. For example, the DC offset for the sensed voltage may shift slightly by approximately 300 mV.

Another disadvantage of the circuit 1 is that, at high signal levels, the diodes 20, 30 will clip the sensed voltage, which greatly reduces the AOP of the circuit. Particularly, each of the diodes 20, 30 has a forward voltage $V_F$ (e.g., 700 mV) at which it will turn on. At high signal levels, the diodes 20, 30 start to turn on, which distorts the sensed voltage. When the sensed voltage falls below $-V_F$, the diode 20 will turn on and clip the sensed voltage. Similarly, when the sensed voltage rises above $+V_F$, then the diode 30 will turn on and clip the sensed voltage.

FIG. 1b shows an exemplary waveform 90 for the sensed voltage at the node 40 of the circuit 1 in response to microphone 10 being subjected to a high SPL 20 Hz acoustical signal. As can be seen, the waveform 90 is distorted (clipped) when the signal level is too high, due to the diodes 20, 30 being turned on. As is apparent, this clipping effect caused by the turning on of the diodes 20, 30 greatly limits the AOP of the microphone circuit 1. FIG. 2 shows a plot illustrating a frequency spectrum 95 of the waveform 90. As can be seen, the frequency spectrum 95 includes a spike at 20 Hz, which corresponds to the actual sound (i.e. the 20 Hz acoustical signal). However, as can also be seen, the frequency spectrum 95 further includes additional large spikes at 40 Hz, 60 Hz, 80 Hz, 100 Hz, 120 Hz, 140 Hz, and 180 Hz, which correspond to the distortion introduced by the turning on of the diodes 20, 30. As is apparent, this clipping effect caused by the turning on of the diodes 20, 30 greatly limits the AOP of the microphone circuit 1.

One configuration that can reduce the distortion effect includes arranging series stacks of the diodes 20, 30 to provide more headroom for the sensed voltage. This modification increases the AOP of the microphone circuit, but has disadvantages. Particularly, this configuration provides reduced effectiveness at higher temperatures (due to a reduction of forward voltage $V_F$ at higher temperatures) and may cause tones in the output signal at normal operation. Another configuration that can increases the AOP of the microphone circuit includes a microphone 10 that is configured with reduced sensitivity. The circuit employs electronic gain to compensate for the reduced sensitivity of the microphone. However, this configuration has the disadvantage of consuming more power. A further configuration that can increase the AOP of the microphone circuit is one in which the gain of the microphone is reduced when high sound levels are detected. However, this configuration has the disadvantage of creating acoustical artifacts, such as clicks and pops, in the output signal. Yet another configuration that can increase the AOP of the microphone circuit is one in which the microphone has multiple membranes with differing sensitivity. The circuit switches between multiple membranes depending on sound levels. However, this configuration also has the disadvantage of creating acoustical artifacts in the output signal.

Accordingly, what is needed is a microphone biasing circuit that achieves a high AOP with high energy efficiency and without introducing acoustical artifacts into the output signal. It would be further advantageous if the microphone biasing circuit had adjustable bandwidth and cutoff frequencies, and faster settling speeds.

SUMMARY

A microphone biasing circuit is disclosed. The microphone biasing circuit comprises a first amplifier having an output connected to a first node and an input connected to a second node; and a first feedback path connected from the first node to the second node. The first feedback path comprises a microphone having a first terminal connected to the first node and a second terminal connected to a third node, the microphone being configured to provide a sensed voltage at the first node in response to sound, the third node having a first DC bias voltage; and a first capacitor connected between the third node and the second node.

BRIEF DESCRIPTION OF THE DRAWINGS

The foregoing aspects and other features of a microphone circuit are explained in the following description, taken in connection with the accompanying drawings.

FIG. 4b shows exemplary frequency planning for the microphone circuit of FIG. 4a.

DETAILED DESCRIPTION

Figure 1A:
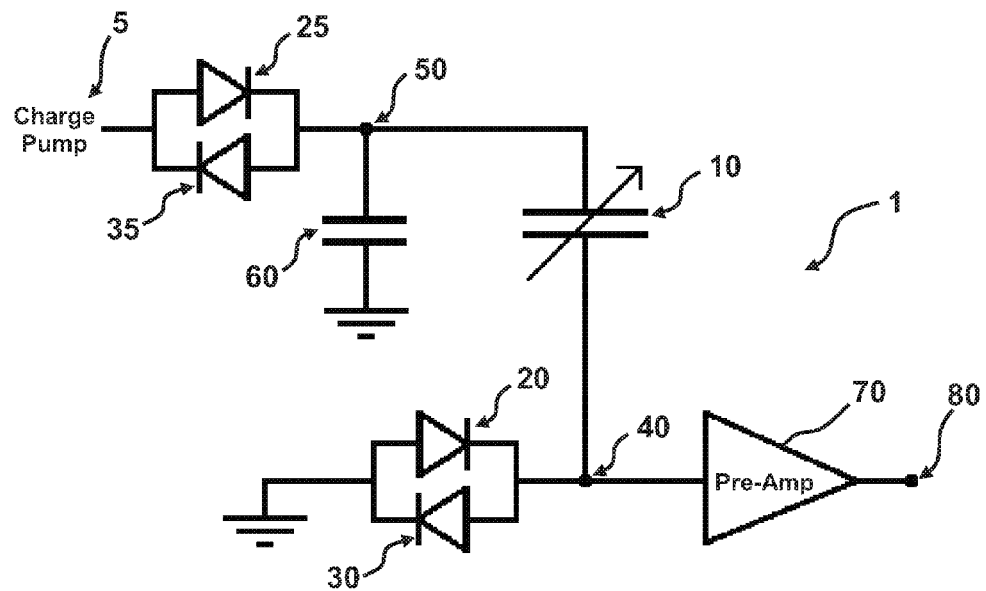
FIG. 1a shows a microphone circuit according to the prior art.
Figure 1B:
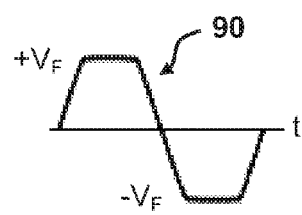
FIG. 1b shows a plot illustrating an exemplary signal sensed by the microphone of FIG. 1a in response to a high SPL acoustical signal.
Figure 2:
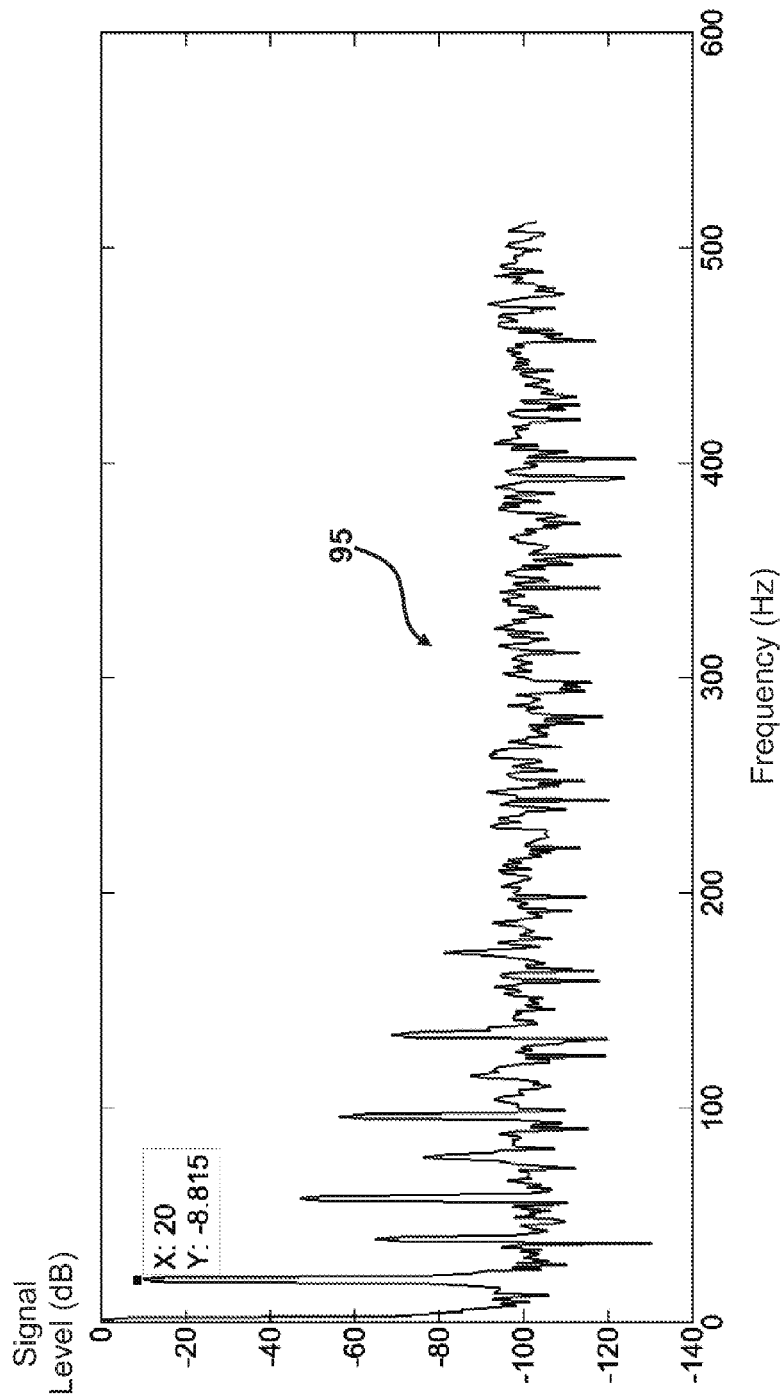
FIG. 2 shows a plot illustrating a frequency spectrum of the waveform of FIG. 1b.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to one skilled in the art which this disclosure pertains.

Figure 3A:
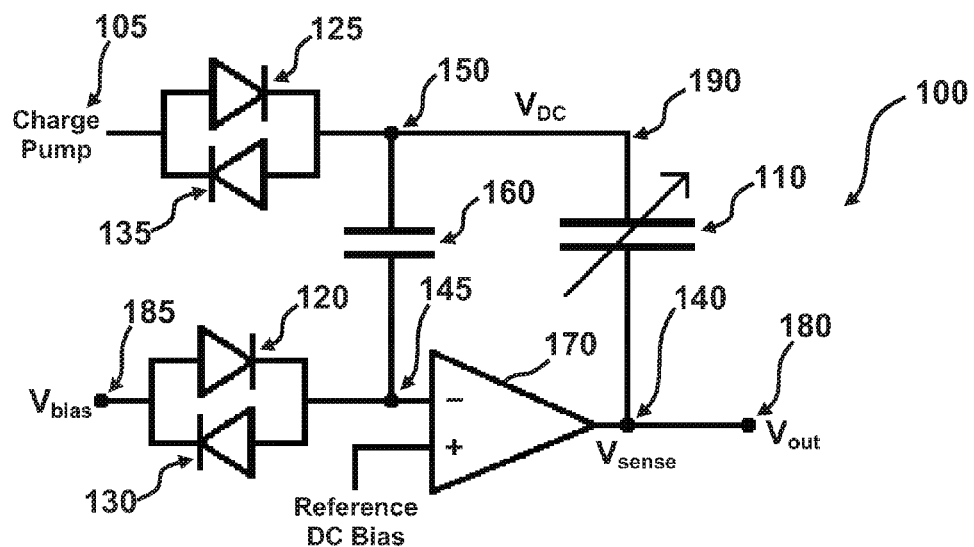
FIG. 3a shows a microphone circuit that utilizes energy efficient antiparallel diode biasing but also has a high AOP.

FIG. 3a shows a microphone circuit 100 that advantageously utilizes energy efficient diode biasing but also has a high AOP. It is noted that, although the circuit 100 is shown and described in a single-ended form, in some embodiments, the circuit 100 is in a differential form. The microphone circuit 100 includes a microphone 110 connected between a node 150 and a node 140. The microphone 110 is configured to modulate the voltage at the node 140 to provide a sensed voltage $V_{sense}$ in response to sound. In at least one embodiment, the microphone 110 is a MEMS (microelectromechanical systems) microphone. In some embodiments, some or all of the components of the microphone circuits described herein are integrated together on a single chip with the MEMS microphone. In many embodiments, the operating principle of the microphone 110 is that of a capacitive sensor having at least one electrically conductive membrane, diaphragm, or the like that is mechanically responsive to sound waves. In the illustrations provided herein, the microphone 110 is depicted schematically as a variable capacitor.

The microphone circuit 100 includes a charge pump 105 configured to provide a predetermined DC bias voltage $V_{DC}$. The circuit 100 includes diodes 125 and 135 which are coupled antiparallel to one another between the charge pump 105 and a node 150. The diodes 125 and 135 operate to couple the predetermined DC bias voltage $V_{DC}$ from the charge pump 105 to the node 150. In one embodiment, the predetermined DC bias voltage $V_{DC}$ is 20 V.

The circuit 100 avoids the problem of signal clipping at high signal levels by placing the microphone 110 in a negative feedback loop and isolating the node 140 from any diodes that could distort the sensed voltage $V_{sense}$. To accomplish this, the circuit 100 includes an amplifier 170, such as an operational amplifier or an operational transconductance amplifier. The output of the amplifier 170 is connected to the node 140. The non-inverting input of the amplifier 170 is connected to a reference voltage, which represents a desired DC bias point. A capacitor 160 is connected between the node 150 and a node 145 at the inverting input of the amplifier 170. In this way, a feedback path 190 is defined between the output of the amplifier 170 and the inverting input of the amplifier 170. The microphone 110 and the capacitor 160 are arranged within the feedback path 190.

The circuit 100 further includes diodes 120 and 130 which are coupled antiparallel to one another between the node 145 and a node 185. The node 185 is connected to a corrective DC bias voltage $V_{bias}$. The diodes 120 and 130 operate to couple the DC bias voltage $V_{bias}$ from the node 185 to the node 145. In one embodiment, $V_{bias}$ is selected such that the voltage at the node 145 is the same as the reference voltage that is connected to the non-inverting input of the amplifier 170. The value of the DC bias voltage $V_{bias}$ at the node 185 can be selected to counteract the undesired DC shift from the desired DC bias point at the node 145 due to leakage currents in the feedback path 190.

In the embodiment shown, the amplifier 170 serves the purpose of a pre-amplifier having high input impedance and low output impedance. However, in some embodiments, the circuit 100 may include separate a pre-amplifier (not shown) having an input connected to the node 140 and configured to provide an output signal $V_{out}$ at an output node 180 based on the sensed voltage $V_{sense}$ at the node 140.

Figure 3B:
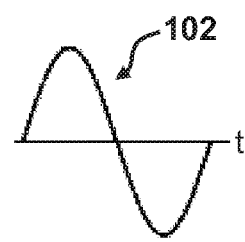
FIG. 3b shows a plot illustrating an exemplary waveform sensed by the microphone of FIG. 3a in response to a high SPL acoustical signal.

It should be noted that, although the node 150 carries the predetermined DC bias voltage $V_{DC}$ provided from the charge pump 105, it is advantageously a virtual AC ground. Accordingly, the diodes 125, 135 are not turned on during operation and do not clip or distort any signal in the feedback path 190. Additionally, the capacitor 160 isolates the node 145 from the predetermined DC bias voltage $V_{DC}$ at the node 150. In this way, the node 145 is a virtual ground, which experiences no substantial AC or DC voltages. As a result, the diodes 120, 130 are also not turned on during operation and do not clip or distort any feedback signals. Furthermore, the amplifier 170 does not experience any high voltages and can, therefore, be designed using low voltage transistors. FIG. 3b shows an exemplary waveform 102 for the sensed voltage $V_{sense}$ at the node 140 of the circuit 100 in response to microphone 110 being subjected to a loud 20 Hz tone. As can be seen, the waveform 102 is not distorted at high signal levels.

As discussed above, in practical implementations of the microphone circuits described herein, the feedback voltage at the node 145, which is input into the inverting input of the amplifier 170, may be shifted slightly from a desired DC bias point due to leakage currents flowing through the capacitor 160 and/or the diodes 120, 130. The DC bias voltage $V_{bias}$ can be selected to counteract the undesired DC shift at the node 145. In some embodiments, the DC bias voltage $V_{bias}$ is provided dynamically by means of an offset correction feedback loop.

Figure 4A:
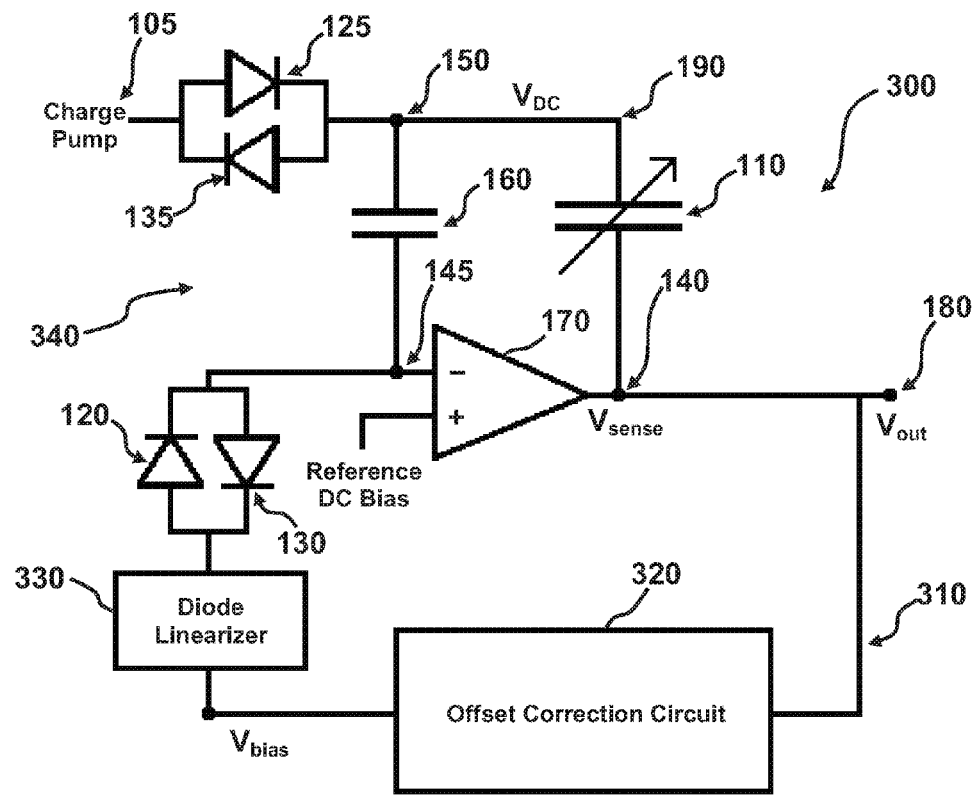
FIG. 4a shows a microphone circuit having an offset correction feedback loop.

FIG. 4a shows a microphone circuit 300 having an offset correction feedback loop. The circuit 300 is similar to the circuit 100 shown in FIG. 3a and like elements are identified to with common reference labels and not described again in detail. In addition to the components of the circuit 100, the circuit 300 includes a further feedback path 310 between the node 140 and the node 145 at the inverting input of the amplifier 170. The feedback path 310 at least includes an offset correction circuit 320 and the diodes 120, 130. In many embodiments, the feedback path 310 further includes a diode linearization circuit 330. Additionally, although the circuit 300 is shown and described in a single-ended form, in some embodiments, the circuit 300 is in a differential form.

The offset correction circuit 320 is connected between the node 140 and the diode linearization circuit 330 and is configured to adjust or correct the DC offset present in the feedback voltage at the node 145, such that it is equal to a desired DC bias point. In one embodiment, the offset correction circuit 320 is configured to provide the DC bias voltage $V_{bias}$ such that the inverting and non-inverting inputs of the amplifier 170 are equal to each other. In some embodiments, the offset correction circuit 320 includes a proportional-integrator circuit and/or a low pass filter circuit. The offset correction circuit 320 can be implemented using analog, digital, or mixed components.

The diode linearization circuit 330 is configured such that, the diodes 120, 130 in combination with the diode linearization circuit 330 have more linear current-voltage characteristics and can be modeled as resistor. The linearization of the diodes 120, 130 enables greater degrees of freedom in stabilizing the feedback loops of the microphone circuit 300. Additionally, the linearization of the diodes 120, 130 enables transient response and/or settling times of the feedback loops of the microphone circuit 300 to be much faster than with non-linearized diodes.

The pole frequency due to diodes and MEMs capacitance is inversely proportional to product of $R_{diode}*C_{mems}$, where $R_{diode}$ is a resistance of the diodes 120, 130 and $C_{mems}$ is a capacitance of the microphone 110. This pole is highly dependent on the leakage currents of the microphone 110, leakage currents of the capacitor 160, and temperature, which makes it difficult to stabilize the system for different microphones and diodes having different intrinsic characteristics. Without the diode linearization circuit 330, the offset correction circuit 320 generally would need to be designed with a very narrow bandwidth, resulting in very slow settling response. The diode linearization circuit 330 enables the feedback loop 310 to stabilize more quickly, and generally provides more degrees of freedom in the design of the offset correction circuit 320. Additionally, the circuit 300 retains the noise advantages of diode biasing and avoids the severe noise penalties associated with low value linear resistors.

Figure 4B:
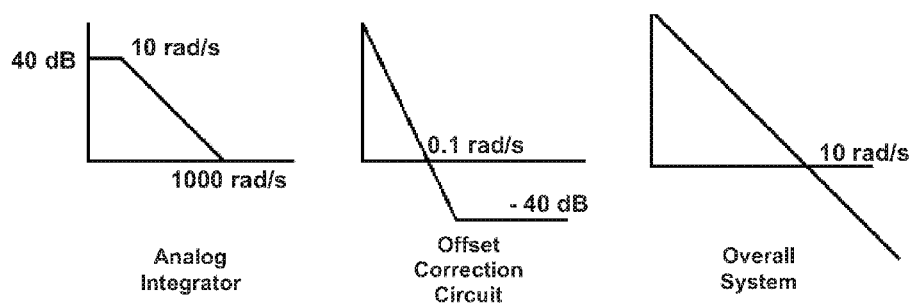

The amplifier 170, the microphone 110, the capacitor 160, the diodes 120, 130, and the diode linearization circuit 330 essentially operate as an analog integrator circuit 340. Particularly, the microphone 110 and capacitor 160 operate as a feedback capacitance for the analog integrator circuit 340. Similarly, the diodes 120, 130, in combination with the diode linearization circuit 330 operate as an input resistance for the analog integrator circuit 340. The cut-off frequencies of the analog integrator circuit 340 are in part defined by the effective resistance of the diodes 120, 130 in combination with the diode linearization circuit 330. For the purpose of frequency planning, the circuit 300 can be divided in two primary circuits, the analog integrator circuit 340 and the offset correction circuit 320. Accordingly, the overall bandwidth of the system and the cut-off frequencies for the system are defined by the analog integrator circuit 340 and the offset correction circuit 320. FIG. 4b shows exemplary frequency planning for the analog integrator circuit 340 and the offset correction circuit 320 in order to achieve a desired overall performance for the circuit 300. As will be discussed in greater detail, the frequencies responses of the analog integrator circuit 340 and the offset correction circuit 320 can be designed and adjusted to shape the frequency response of the overall system.

Figure 5:
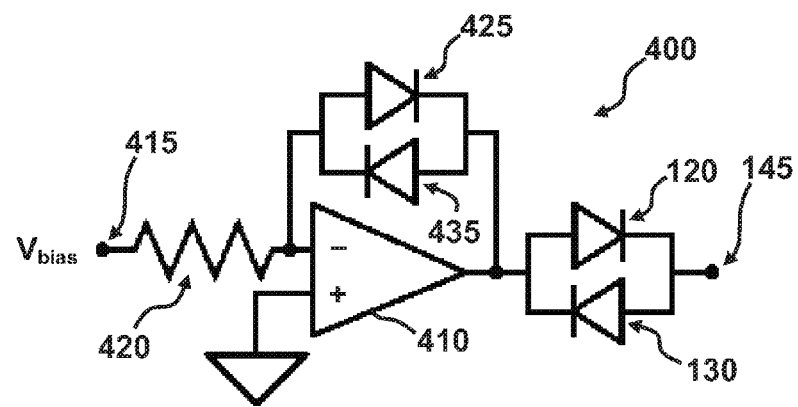
FIG. 5 shows an exemplary diode linearization circuit.

FIG. 5 shows a diode linearization circuit 400, which is an exemplary embodiment of the diode linearization circuit 330. The diode linearization circuit 400 includes an amplifier 410, such as an operational amplifier. An input resistor 420 is connected between a node 415 having the DC bias voltage $V_{bias}$, which is received from the offset correction circuit 320, and the inverting input of the amplifier 410. The non-inverting input of the amplifier 410 is connected to a fixed common voltage, such as ground. The circuit 400 includes diodes 425, 435 that are coupled antiparallel to one another between the output of the amplifier 410 and the inverting input of the amplifier 410. Finally, the diodes 120, 130 are coupled antiparallel to one another between the node 145 and an output of the amplifier 410. It is noted that that the diodes 120, 130 and the node 145 correspond to those of the circuit 300 shown in FIG. 4a. In one embodiment, the diodes 425, 435 are N times larger than the diodes 120, 130. The noise of the input resistor 420 is attenuated by a factor of $N^2$.

Figure 6:
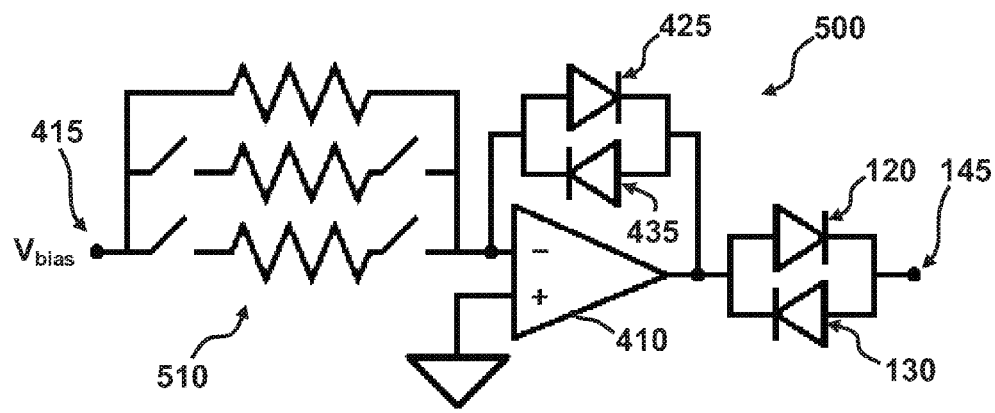
FIG. 6 shows the diode linearization circuit of FIG. 5 having a variable input resistance.

FIG. 6 shows a diode linearization circuit 500, which is similar to the diode linearization circuit 400, except that is has an adjustable input resistance. Particularly, the diode linearization circuit 500 includes variable resistance circuit 510 in place of the input resistor 420. As shown, the variable resistance circuit 510 includes a plurality of resistors connected in parallel with one another and having different resistance values. In one embodiment, the resistances of each resistor progressively vary by a predetermined factor from one another (e.g., 2×, 5×, 10×, 100×). The variable resistance circuit 510 includes switches connected in series with each resistor. The switches can be closed or opened to establish different current paths through individual or parallel combinations of the resistors, thereby providing adjustable input resistance for the diode linearization circuit 500. In other embodiments, the variable resistance circuit 510 may instead comprise a potentiometer or any other type of variable resistance. As discussed in greater detail below, the variable resistance can be used to adjust the bandwidth and cutoff frequencies of the analog integrator circuit 340.

Figure 7:
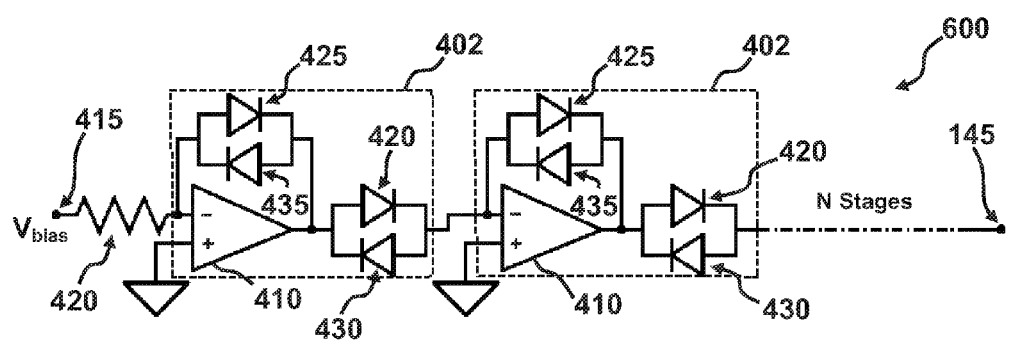
FIG. 7 shows a cascaded form of the diode linearization circuit of FIG. 5.
Figure 8:
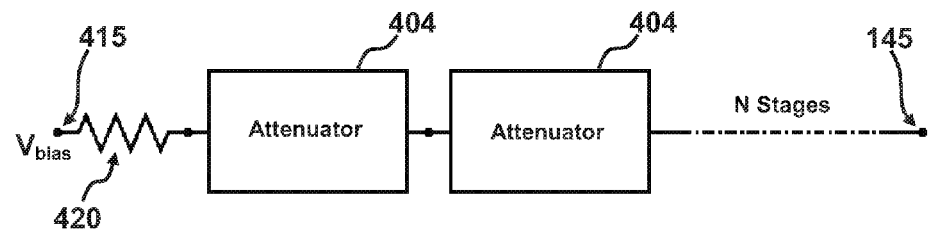
FIG. 8 shows a cascaded diode linearization circuit formed by a series of attenuators.

FIG. 7 shows a cascaded diode linearization circuit 600. The cascaded diode linearization circuit 600 is similar to the diode linearization circuit 400. However, the diode linearization circuit 600 includes a plurality of stages 402. Each stage 402 comprises an amplifier 410 having diodes 425, 435 connected antiparallel to one another between the output of the respective amplifier 410 and the inverting input of the respective amplifier 410. The non-inverting input of each amplifier is connected to a fixed common voltage, such as ground. Diodes 420, 430 are coupled antiparallel to one another between each amplifier 410. In at least the last stage 402, the diodes 420, 430 are one and the same as the diodes 120, 130, discussed above. Alternatively, in other embodiments, the stages 402 may be replaced by attenuator circuits 404 cascaded in series, as shown in FIG. 8.

Figure 9:
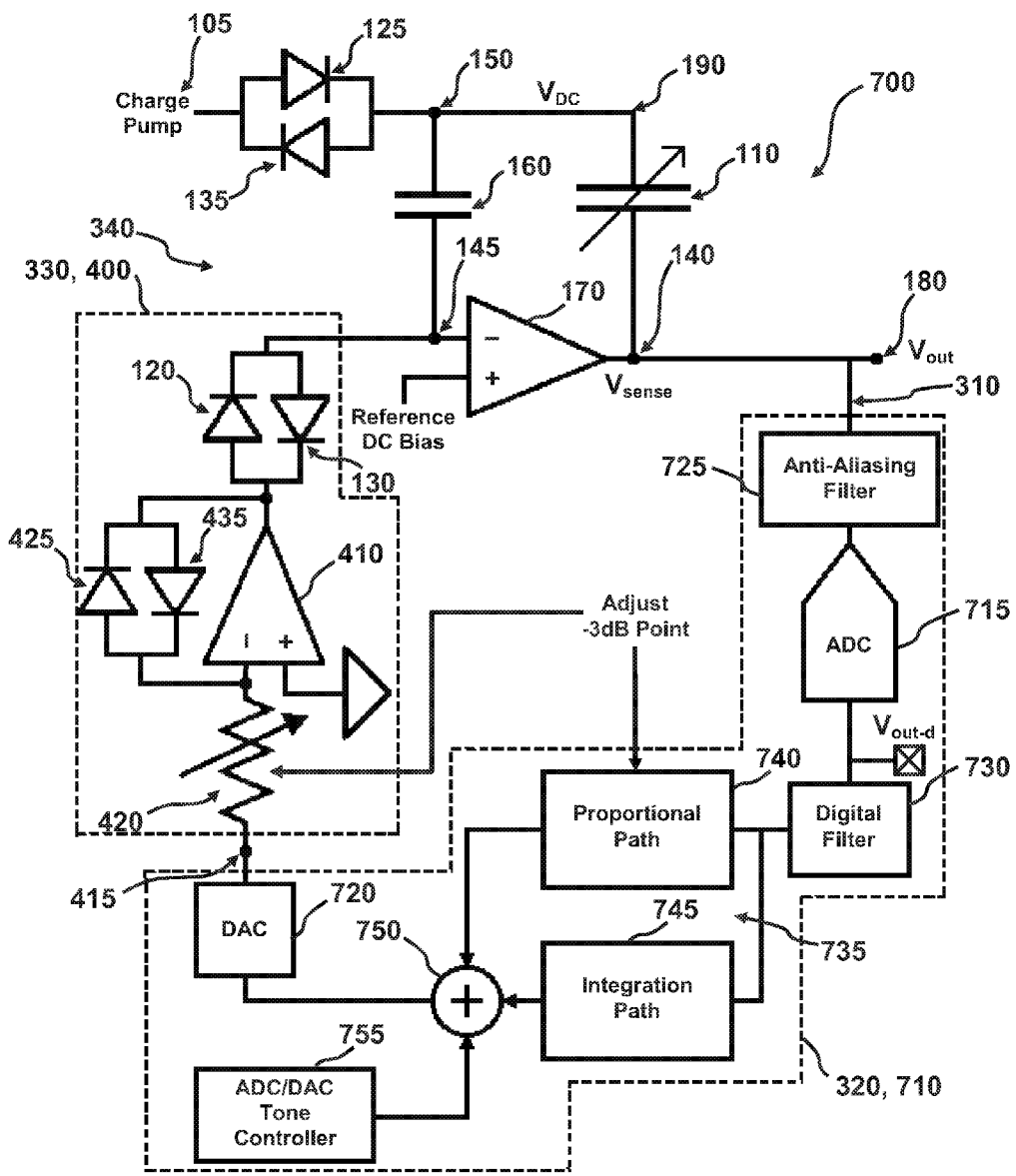
FIG. 9 shows a microphone circuit having an exemplary digital offset correction circuit.

FIG. 9 shows a microphone circuit 700, which is a preferred embodiment of the microphone circuit 300 of FIG. 4a, which includes a digital implementation of the offset correction circuit 320. The microphone circuit 700 includes the feedback path 310, which includes the offset correction circuit 320, the diode linearization circuit 330, and the diodes 120, 130. The diode linearization circuit 330 is embodied as described with respect to the diode linearization circuit 400 of FIG. 5, except that the input resistor 420 is illustrated as a variable resistance. The offset correction circuit 320 is embodied as a digital offset correction circuit 710. The digital offset correction circuit 710 is configured to adjust or correct the DC offset present in the feedback voltage at the node 145, such that it is equal to a desired DC bias point. In one embodiment, the digital offset correction circuit 710 is configured to provide the DC bias voltage $V_{bias}$ such that the inverting and non-inverting inputs of the amplifier 170 are equal to each other.

The digital offset correction circuit 710 includes an analog-to-digital converter (ADC) 715 connected to the node 140 and configured to digitize the output signal at the node 140 to provide a digital feedback signal. The digital offset correction circuit 710 further includes a digital-to-analog converter (DAC) 720 connected to the node 415 of the diode linearization circuit 400 and configured to convert the digital feedback signal back to an analog voltage. In one embodiment, the ADC 715 provides a digital output $V_{out\text{-}d}$. In one embodiment, the ADC 715 is a delta-sigma based converter, which may comprise a delta-sigma modulator and a digital filter. In one embodiment, the DAC 720 is a delta-sigma based converter, which may comprise a delta-sigma modulator and an analog filter.

In one embodiment, the digital offset correction circuit 710 includes an anti-aliasing filter 725 is connected between the node 140 and the ADC 715. The anti-aliasing filter 725 is configured constrain the bandwidth of the output signal to prevent aliasing when digitized by the ADC 715. Particularly, the anti-aliasing filter 725 is at least configured to remove or attenuate alternating components from the output signal that have frequencies greater than half the sampling rate of the ADC 715.

In one embodiment, the digital offset correction circuit 710 further includes a digital filter 730 and a proportional integrator 735 configured to adjust or correct the DC offset present in the feedback voltage at the node 145, such that it is equal to a desired DC bias point. In one embodiment, digital filter 730 and a proportional integrator 735 are configured to provide the DC bias voltage $V_{bias}$ such that the inverting and non-inverting inputs of the amplifier 170 are equal to each other. In one embodiment, the digital filter 730 is a low-pass filter. In one embodiment, the digital filter 730 comprises a cascaded integrator-comb (CIC) filter comprising one or more integrator and comb filter pairs. In one embodiment, the digital filter 730 is configured to slow a roll off from 200 Hz to 20 KHz. In the embodiment shown, the proportional integrator 735 comprises a proportional path 740 and an integration path 745, which are combined by an adder element 750.

In some embodiments having a delta-sigma based ADC 715 and/or DAC 720, the distortion performance of the ADC 715 and/or DAC 720 can be affected by the DC offset in the output signal at the node 140. In one embodiment, the digital offset correction circuit 710 further includes an ADC/DAC tone controller 755 configured to provide an offset signal that reduces a distortion in the ADC 715 and/or DAC 720. In one embodiment, ADC/DAC tone controller 755 is connected to the adder element 750 to inject the offset signal into the digital feedback signal after the proportional integrator 735. In other embodiments, the ADC/DAC tone controller 755 is connected connect to some other adder element to inject the offset signal into the digital feedback signal elsewhere in the feedback path 310.

In one embodiment, the digital offset correction circuit 710 further includes a startup accelerator (not shown) arranged in the feedback path 310. The startup accelerator is configured to store predefined or measured startup values for digital feedback signal in memory, which serve as initial conditions during startup of the digital feedback loop. In this way, the digital feedback loop is able startup faster.

Figure 10:
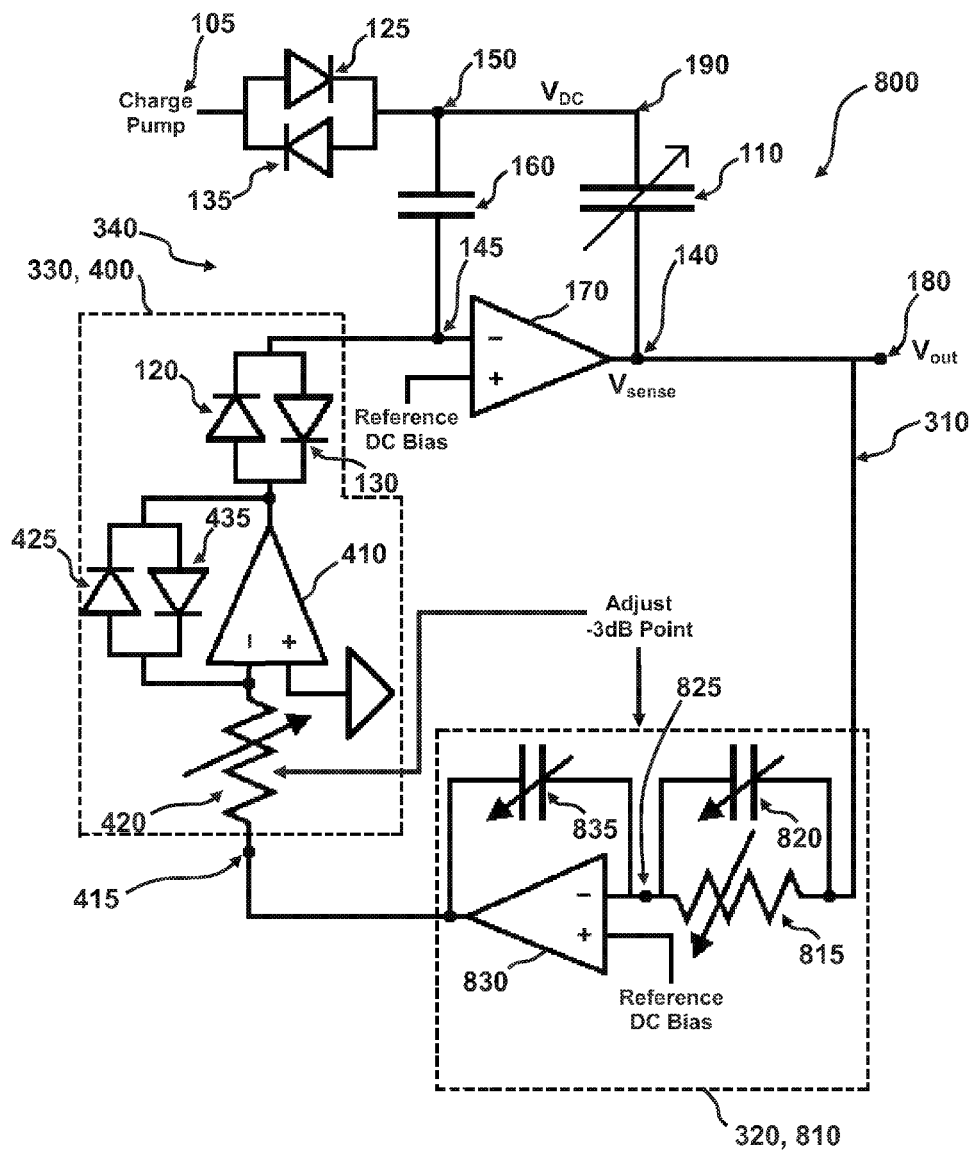
FIG. 10 shows a microphone circuit having an exemplary analog offset correction circuit.

FIG. 10 shows a microphone circuit 800, which is another embodiment of the microphone circuit 300 of FIG. 4a, which includes an analog implementation of the offset correction circuit 320. The microphone circuit 800 includes the feedback path 310, which includes the offset correction circuit 320, the diode linearization circuit 330, and the diodes 120, 130. The diode linearization circuit 330 is embodied as described with respect to the diode linearization circuit 400 of FIG. 5, except that the input resistor 420 is illustrated as a variable resistance. The offset correction circuit 320 is embodied as an analog offset correction circuit 810. The analog offset correction circuit 810 is configured to adjust or correct the DC offset present in the feedback voltage at the node 145, such that it is equal to a desired DC bias point. In one embodiment, the analog offset correction circuit 810 is configured to provide the DC bias voltage $V_{bias}$ such that the inverting and non-inverting inputs of the amplifier 170 are equal to each other.

The analog offset correction circuit 810 includes a resistor 815 and a capacitor 820 connected in parallel with one another between the node 140 and a node 825. The node 825 is connected to an inverting input of an operational amplifier 830. A non-inverting input of the operational amplifier 830 is connected reference voltage, which represents the desired DC bias point. The output of the operational amplifier 830 is connected to the node 415 of the diode linearization circuit 400. The analog offset correction circuit 810 further includes a capacitor 835 connected between the output of the operational amplifier 830 and the inverting input of the operational amplifier 830. In at least one embodiment, the resistor 815 has a variable/adjustable resistance. In at least one embodiment, the capacitor 820 and/or the capacitor 835 have variable/adjustable capacitance.

The microphone circuits 700, 800 enable the bandwidth and −3 dB cut-off frequencies to be flexibly adjusted while maintaining feedback stability and fast settling times. Particularly, in both of the microphone circuits 700, 800, the resistance of the input resistor 420 can be adjusted to modify the −3 dB cutoff frequencies and bandwidth of the analog integrator circuit 340. For the microphone circuit 700, a proportionality constant of the proportional path 740 and an integrator gain bandwidth of the integration path 745 can be adjusted to modify the −3 dB cutoff frequencies and bandwidth of digital offset correction circuit 710. Similarly, for the microphone circuit 800, the resistance of the resistor 815, the capacitance of the capacitor 820, and/or the capacitance of the capacitor 835 can be adjusted to modify the −3 dB cutoff frequencies and bandwidth of the analog offset correction circuit 810. As discussed above, the response characteristics of the analog integrator circuit 340 and the offset correction circuit 320, 710, 810 together define the overall response of the microphone circuits 700, 800. Additionally, we note that the low frequency −3 dB point is adjustable using a feedback loop that already performs DC offset correction and that greatly improves transient setting speeds. Other methods for adjust −3 dB cutoff frequencies and bandwidth generally introduce noise and require separate feedback loops for multiple functionalities.

Figure 11:
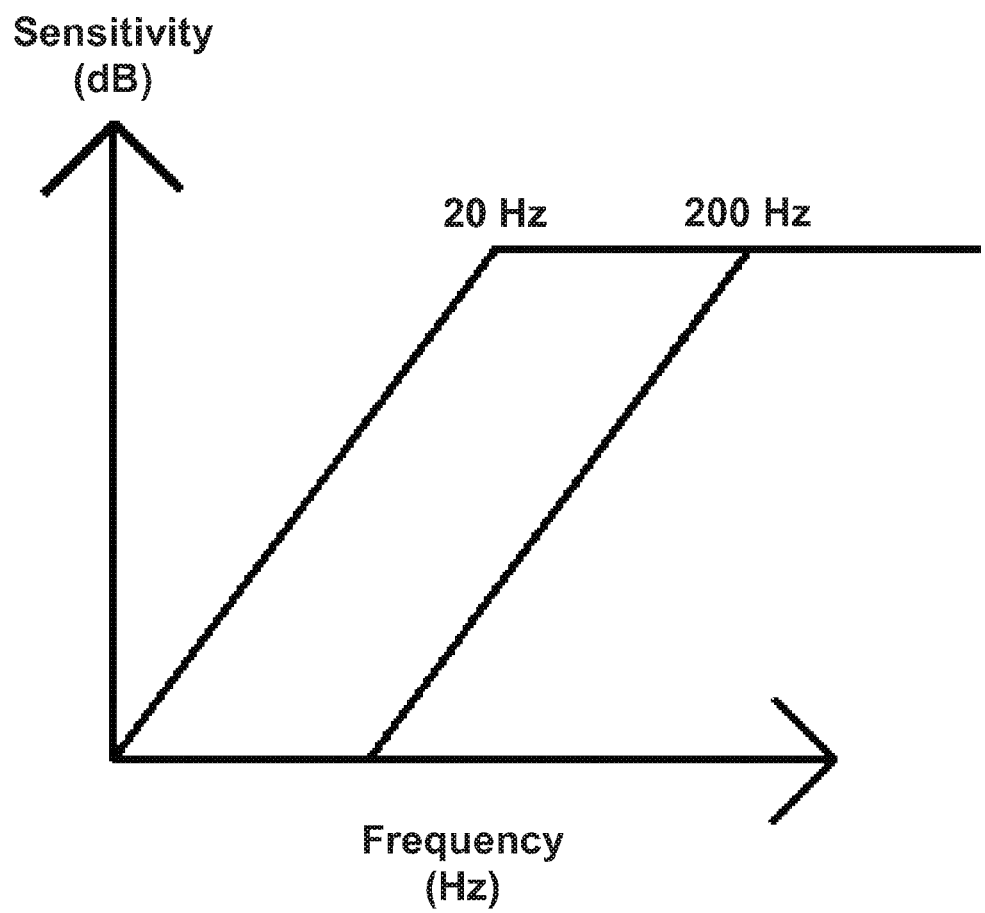
FIG. 11 shows an example of the low frequency −3 dB point being adjusted by an order of magnitude.

FIG. 11 shows an example of the low frequency −3 dB point being adjusted by an order of magnitude. Due to the linearized current-voltages characteristics of the diodes 120, 130 in combination with the diode linearization circuit 400, the −3 dB cutoff frequencies and bandwidth of the circuit 700 or the circuit 800 can be adjusted without affecting stability. The adjustability of the low frequency −3 dB point has advantages such being able to filter out wind noise. Although not illustrated, it is noted that the microphone circuits 700, 800 also enable adjustability of the high frequency −3 dB point.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A microphone biasing circuit comprising:
   a first amplifier having an output connected to a first node and an input connected to a second node; and
   a first feedback path connected from the first node to the second node, the first feedback path comprising:
      a microphone having a first terminal connected to the first node and a second terminal connected to a third node, the microphone being configured to provide a sensed voltage at the first node in response to sound, the third node having a first DC bias voltage; and
      a first capacitor connected between the third node and the second node.

2. The microphone biasing circuit of claim 1, wherein the first amplifier is an operational amplifier having an inverting input connected to the second node and a non-inverting input connected to a fixed reference voltage.

3. The microphone biasing circuit of claim 1, further comprising:
   a charge pump circuit configured to provide the first DC bias voltage; and
   a first diode and a second diode, each connected between the charge pump circuit and the third node, the first diode and the second diode being connected antiparallel with one another.

4. The microphone biasing circuit of claim 1, further comprising:
   a third diode and a fourth diode, each connected between the second node and a fourth node, the third diode and the fourth diode being connected antiparallel with one another, the fourth node having a second DC bias voltage that is coupled to the second node via the third diode and the fourth diode.

5. The microphone biasing circuit of claim 4, further comprising:
   a second feedback path connected from the first node to the fourth node, the second feedback path comprising:
      an offset correction circuit arranged in the second feedback path and configured to adjust a DC offset of a feedback voltage at the second node to have a predetermined magnitude.

6. The microphone biasing circuit of claim 5, the offset correction circuit comprising:
   at least one of (i) a low pass filter circuit and (ii) a proportional-integrator circuit arranged in the second feedback path and configured to adjust the DC offset of the feedback voltage at the second node to have the predetermined magnitude.

7. The microphone biasing circuit of claim 6, wherein a gain and bandwidth of the at least one of the low pass filter and the proportional-integrator is adjustable to modify at least one of a bandwidth and a cut-off frequency of the microphone biasing circuit.

8. The microphone biasing circuit of claim 5, the offset correction circuit comprising:
   a resistor and second capacitor connected in parallel between the first node and a fifth node;
   a second amplifier having an output connected to the fourth node and an input connected to the fifth node; and
   a third capacitor connected from the output of the second amplifier to the input of the second amplifier.

9. The microphone biasing circuit of claim 8, wherein at least one of a resistance of the resistor, a capacitance of the second capacitor, and a capacitance of the third capacitor is adjustable to modify at least one of a bandwidth and a cut-off frequency of the microphone biasing circuit.

10. The microphone biasing circuit of claim 5, the offset correction circuit comprising:
    at least one of (i) a digital low pass filter and (ii) a digital proportional-integrator arranged in the second feedback path and configured to adjust the DC offset of the feedback voltage at the second node to have the predetermined magnitude;
    an analog-to-digital converter arranged in the second feedback path between the first node and an input of one of the at least one of digital low pass filter and digital proportional-integrator; and
    a digital-to-analog converter arranged in the second feedback path between the fourth node and an output of one of the at least one of the digital low pass filter and digital proportional-integrator.

11. The microphone biasing circuit of claim 10, wherein a gain and bandwidth of the at least one of the digital low pass filter and the digital proportional-integrator is adjustable to modify at least one of a bandwidth and a cut-off frequency of the microphone biasing circuit.

12. The microphone biasing circuit of claim 10, the offset correction circuit comprising:
    an anti-aliasing filter arranged in the second feedback path between the first node and the analog-to-digital converter.

13. The microphone biasing circuit of claim 5, further comprising:
    a diode linearization circuit, which includes the third diode and the fourth diode, arranged in the second feedback path, the diode linearization circuit configured to have substantially linear current-voltage characteristics.

14. The microphone biasing circuit of claim 5, further comprising:
    a third amplifier arranged in the second feedback path having an output connected the fourth node and an input connected to a sixth node;

an input resistance arranged in the second feedback path connected between an output of the offset correction circuit and the input of the third amplifier; and a fifth diode and a sixth diode, each connected between the output of the third amplifier and the input of the third amplifier, the fifth diode and the sixth diode being connected antiparallel with one another.

15. The microphone biasing circuit of claim 14, wherein the input resistance has a variable resistance that is adjustable to modify at least one of a bandwidth and a cut-off frequency of the microphone biasing circuit.

16. The microphone biasing circuit of claim 5, further comprising:

a variable resistance arranged in the second feedback path connected between an output of the offset correction circuit and a sixth node; and a plurality of attenuator circuits arranged in the second feedback path connected in series between the sixth node and the fourth node.

17. The microphone biasing circuit of claim 5, further comprising:

a resistance arranged in the second feedback path connected between an output of the offset correction circuit and a sixth node; and a plurality of circuits arranged in the second feedback path connected in series between the sixth node and the fourth node, each circuit comprising:

a third amplifier;

a fifth diode and a sixth diode, each connected between the output of the third amplifier and an output of the respective circuit, the fifth diode and the sixth diode being connected antiparallel with one another; and a seventh diode and an eighth diode, each connected between the output of the third amplifier and the input of the third amplifier, the seventh diode and the eighth diode being connected antiparallel with one another, wherein the third diode and the fourth diode are the fifth diode and the sixth diode for one of the circuits in the plurality of circuits.

18. The microphone biasing circuit of claim 1, wherein the microphone comprises a capacitive transducer.

19. The microphone biasing circuit of claim 1, wherein the microphone comprises a microelectromechanical systems (MEMS) transducer.

* * * * *